(12) United States Patent
Michael et al.

(10) Patent No.: US 7,550,859 B2
(45) Date of Patent: Jun. 23, 2009

(54) SYSTEM AND METHOD FOR HERMETICALLY SEALING A PACKAGE

(75) Inventors: Don Michael, Monmoth, OR (US); Mari J. Rossman, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 129 days.

(21) Appl. No.: 11/842,806

(22) Filed: Aug. 21, 2007

(65) Prior Publication Data

US 2007/0290309 A1 Dec. 20, 2007

Related U.S. Application Data

(62) Division of application No. 10/693,213, filed on Oct. 23, 2003, now Pat. No. 7,276,398.

(51) Int. Cl.
*H01L 23/29* (2006.01)
*H01L 21/44* (2006.01)
*H01L 21/48* (2006.01)
*H01L 21/50* (2006.01)

(52) U.S. Cl. .................. 257/788; 438/124; 438/126

(58) Field of Classification Search ............... 438/124, 438/126; 257/788, E23.127
See application file for complete search history.

(56) References Cited

U.S. PATENT DOCUMENTS

| 6,303,986 | B1 | 10/2001 | Shook |
| 6,541,314 | B2 | 4/2003 | Kobayashi |
| 6,566,745 | B1 | 5/2003 | Beyne et al. |
| 6,588,949 | B1 | 7/2003 | Zhou |
| 2001/0025721 | A1 | 10/2001 | Maeda et al. |

*Primary Examiner*—William M. Brewster

(57) ABSTRACT

A method for hermetically sealing a package includes applying a light or energy active resist to a fill port to act as a temporary hermetic seal, patterning the resist, and applying a solder to the fill port, wherein the solder is configured to serve as a hermetic seal.

21 Claims, 10 Drawing Sheets

SYSTEM AND METHOD FOR HERMETICALLY SEALING A PACKAGE

This application is a divisional of 10/693,213, filed Oct. 23, 2003 now U.S. Pat. No. 7,276,398, which is hereby incorporated by reference.

BACKGROUND

As integrated circuit (IC) geometries continue to decrease, and with the advent of Micro-Electro Mechanical Systems (MEMS), the need for reliable, high density packaging solutions increases. A promising solution for providing reliable packaging for chips of continually decreasing size is Wafer Level Packaging (WLP). WLP is a packaging method in which packaging is formed at the wafer level in an IC foundry or other processing location, allowing testing and burn-in to be performed before the dicing of individual chips.

In certain wafer level packaging (WLP) methods, small cavities or enclosures of an IC or MEMS package may be filled with fluid. In many such applications, fluid filling of a WLP may need to be performed in such a way as to prevent bubbles or gaseous pockets from forming in the fluid filled cavities.

Fluid packaging may perform a number of functions essential for an IC or MEMS device. Packaging may provide electrical connection, electrical isolation or passivation from moisture and electrolytes, physical isolation from the environment to provide structural integrity of mechanical devices, thermal and optical protection to prevent undesirable performance changes, and chemical isolation to protect from harsh chemical environments. Electrical connection and isolation may include providing electrical connections from the outside of the MEMS package to electrical or mechanical components of the MEMS device inside the package, electrostatic shielding of the MEMS device, and preventing penetration of moisture and subsequent corrosion of electrical components or undesired interface adhesion. Mechanical protections may provide rigidity allowing mechanical stability throughout the MEMS product life- and may also help prevent undesirable interface stress between dissimilar materials. If the packaging protection is compromised, the MEMS device may fail, producing no output for a given input or producing invalid or inaccurate output for a given input.

SUMMARY

A method for hermetically sealing a package includes applying a light or energy active resist to a fill port to act as a temporary hermetic seal, patterning the resist, and applying a solder to the fill port, wherein the solder is configured to serve as a hermetic seal.

BRIEF DESCRIPTION OF THE DRAWINGS

The accompanying drawings illustrate various embodiments of the present system and method and are a part of the specification. The illustrated embodiments are merely examples of the present system and method for creating a hermetic seal and do not limit the scope thereof. The summary and other features and aspects of the present system and method will become further apparent upon reading the following detailed description and upon reference to the drawings in which.

Throughout the drawings, identical reference numbers designate similar, but not necessarily identical, elements.

DETAILED DESCRIPTION

Figure 1:
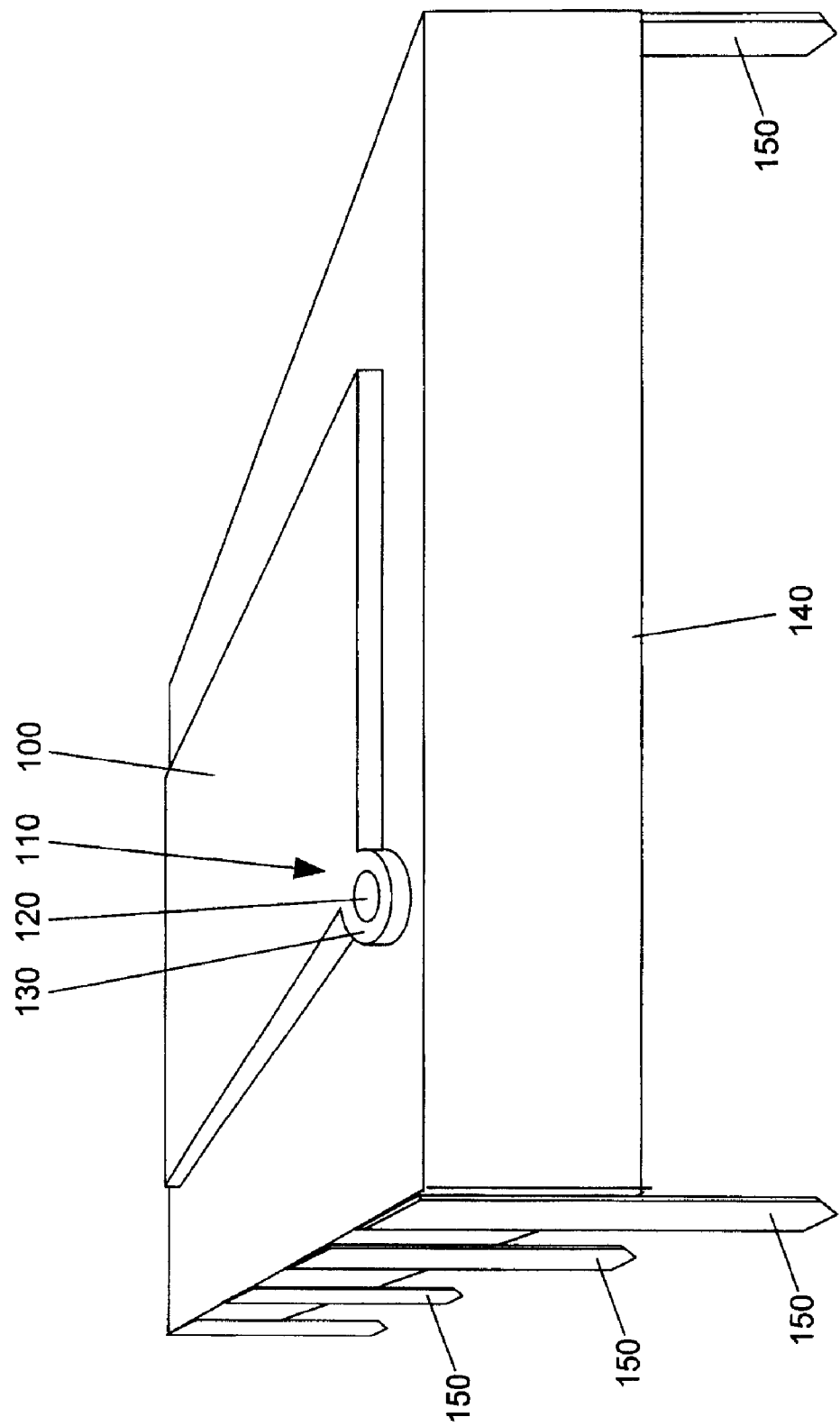
FIG. 1 is a perspective view of a MEMS package according to one exemplary embodiment.

The present specification discloses a system and a method for hermetically sealing a fluid filled integrated circuit (IC) package. More specifically, the present method includes a system and a method for applying a photo resist material to a fill port as a temporary seal, patterning (i.e., applying, exposing, and developing) the photo resist, and subsequently applying solder to form a permanent hermetic seal over the fill port. A layer of photo resist may be left between the packaging fluid and the solder in order to insulate the packaging fluid from hot, molten solder during solder application.

As used in this specification and in the appended claims, the term "Micro-Electro Mechanical System" or "MEMS" is meant to be understood broadly as describing any very small (micro) mechanical device that may be constructed on a single semiconductor chip and which may be fabricated using integrated circuit (IC) batch-processing techniques. MEMS may be broadly classified as sensors, actuators, a combination of sensors and actuators, or added circuitry for processing or control. Additionally, a MEMS may include an optical component, making it a micro-electro-optical mechanical system or MEOMS. For the purposes of present specification and appended claims, the term MEMS is meant to refer to any of the above-mentioned classes. The term "package" or "packaging" is meant to be understood as any enclosure or support for a MEMS device providing electrical connection or isolation, and mechanical, thermal, chemical, or optical isolation or passivation in order to protect the function and prolong the life of the MEMS.

A "fill port" is meant to be understood as any opening in a MEMS package that may be used to evacuate the MEMS package of, or fill the MEMS package with, a fluid (liquid or gas). Similarly, a "fill port plug" is meant to be understood as any material configured to function as a seal, either temporarily or permanently, over a fill port. A "hermetic" seal is meant to be understood as any seal which is substantially impervious to moisture and gases. A "photo resist" is meant to be understood as any photo-active polymer or material which may become more or less soluble in a particular solvent due to a physical or chemical change after exposure to light, electromagnetic radiation, or high energy particle beams. "Exposure" is meant to be understood as a process in which photo resist is selectively exposed to electromagnetic radiation or a particle beam and subsequently experiences a physical or chemical change. The term "development" is meant to be understood as a process in which a solvent or "developer" is introduced to a previously exposed photo resist in order to remove a portion of the photo resist. The term "developer" is meant to denote a solution in which a previously exposed photo resist may be developed.

In the following specification, for purposes of explanation, numerous specific details are set forth in order to provide a thorough understanding of the present system and method for creating a hermetic seal to contain a fluid in an IC package. It will be apparent, however, to one skilled in the art, that the present method may also be practiced on any IC either with or without these specific details. Reference in the specification to "one embodiment" or "an embodiment" means that a particular feature, structure, or characteristic described in connection with the embodiment is included in at least one embodiment. The appearance of the phrase "in one embodiment" in various places in the specification are not necessarily all referring to the same embodiment.

Exemplary Structure

According to one exemplary method for IC or MEMS packaging, a fluid is introduced into the package which may surround portions of mechanical or electrical devices. This fluid may afterwards be hermetically sealed inside the package. MEMS packaging of this type may include a number of methodology design challenges including, but in no way limited to, maintaining a precise amount of packaging fluid in the MEMS package in order to maintain a given fluid pressure inside the package, making and maintaining intimate contact between the fill port plug and the packaging fluid in order to prevent air pockets from forming in the packaging fluid, using a fill port plug material that is fluid before it cures so that it may flow into the fill port plug geometry, and using a fill port plug material which may adhere to gold and other fill port materials to form a hermetic seal. Maintaining a given fluid pressure inside the MEMS package may be complicated by a tendency of the packaging fluid to evaporate before an hermetic seal is in place in the fill port and by a tendency of the packaging fluid to boil when traditional hermetic seals are applied at a temperature high enough to make the seal material flow but also high enough to boil the packaging fluid. The present system and method may provide solutions to such packaging process design issues.

FIG. 1 illustrates a perspective view of a MEMS package. As shown in FIG. 1, the MEMS package may include an inner enclosure (100) which may surround a MEMS device or devices. As shown in FIG. 1, the inner enclosure (100) may include a fill port (110) having a fill port channel (120) and a surrounding pad (130). Moreover, the inner enclosure (100) may be surrounded by an outer enclosure (140) and electrical coupling pins (150).

The inner enclosure (100) illustrated in FIG. 1 may be constructed out of silicon, silicon dioxide, glass, gold, or another material. In the case of a silicon inner enclosure (100), one silicon wafer may be fused to another silicon wafer with a space hollowed out to fit the MEMS device or devices between the silicon wafers. In any case, the inner enclosure (100) may form a hermetic barrier around MEMS devices interior to it except for an open fill port (110) or fill ports. The fill port (110) may include a fill port channel (120) and a surrounding pad (130) against the surface of which a hermetic seal may later be attached. The channel (120) and pad (130) surfaces may be gold or another material. For the purpose of explanation only, the channel (120) and pad (130) surfaces are considered to be gold in the present embodiment, although other materials may also be used.

An outer enclosure (140) may also be manufactured to surround a portion of the inner enclosure (100). The outer enclosure (140) may be composed of a ceramic, a plastic, or another material. Electrical connections made to MEMS devices inside the inner enclosure (100) may extend through the inner enclosure (100) and outer enclosure (140) to the outside of the package and will be referred to as electrical coupling pins (150). The electrical coupling pins (150) are illustrated as being laid out in a dual inline package (DIP), though they may exit the MEMS package in any of a number of configurations (not shown), and may later be used to allow electrical signals to enter and exit the MEMS. In an alternative MEMS package design, there may be no outer enclosure (140); rather, the MEMS device may be formed directly on a silicon or other type of wafer.

Figure 2:
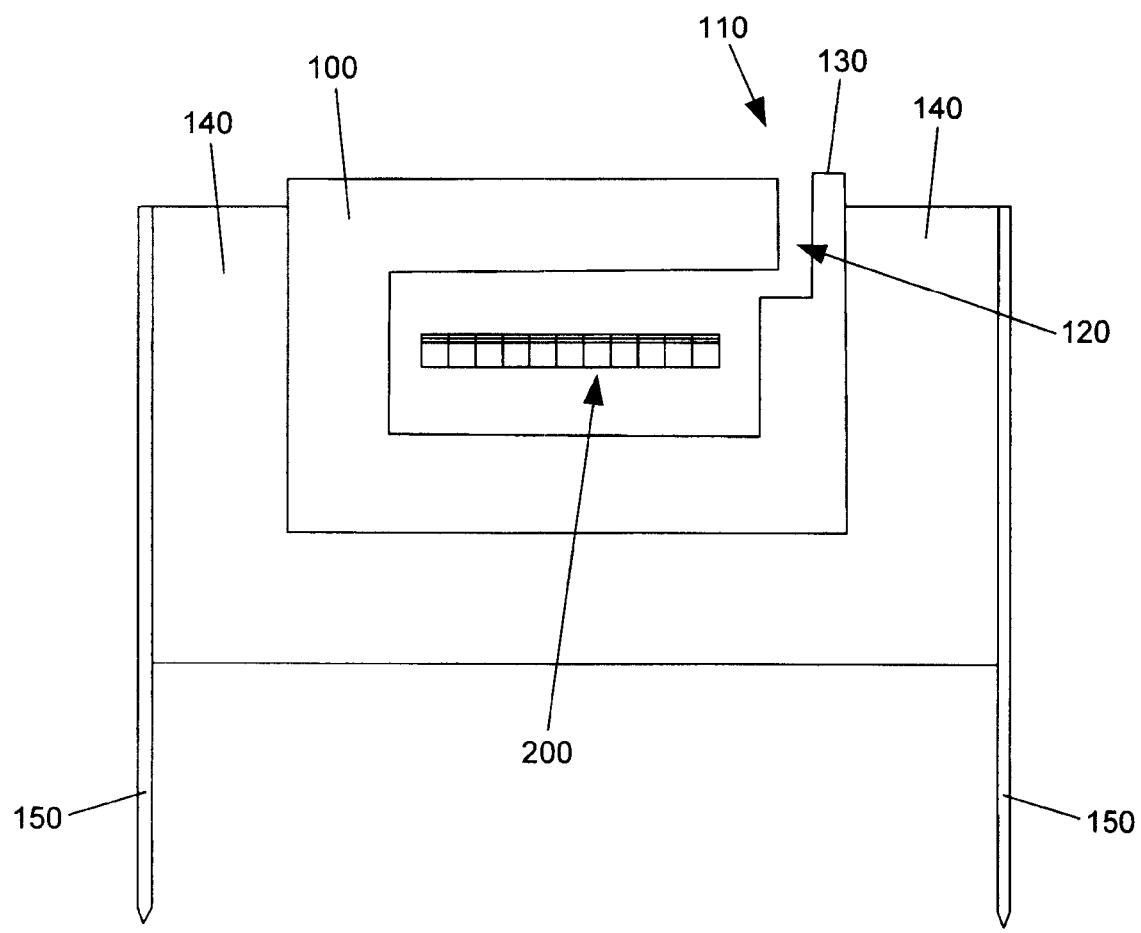
FIG. 2 is a cross-sectional view of a MEMS package according to one exemplary embodiment.

FIG. 2 is a cross-section of a MEMS package illustrating portions of the inner enclosure (100) and outer enclosure (140). As shown in FIG. 2, the inner enclosure (100) includes a fill port (110) having a fill port channel (120) and a fill port pad (130). A MEMS (200) is shown inside the package and may be coupled to the packaging at a closer or farther cross-section of the packaging (not shown). The MEMS may also be coupled to package pins (150), though the means of coupling is not shown here and may take place at closer and/or farther sections of the packaging. As shown in FIG. 2, the fill port (110) provides a fill port channel (120) coupling the MEMS and the inner enclosure (100) to the outside environment. The fill port (110) and its associated fill port channel (120) may be configured to accept and facilitate the filling of the inner enclosure (100) with a filling fluid as will be explained in further detail below.

Exemplary Implementation and Operation

Figure 3:
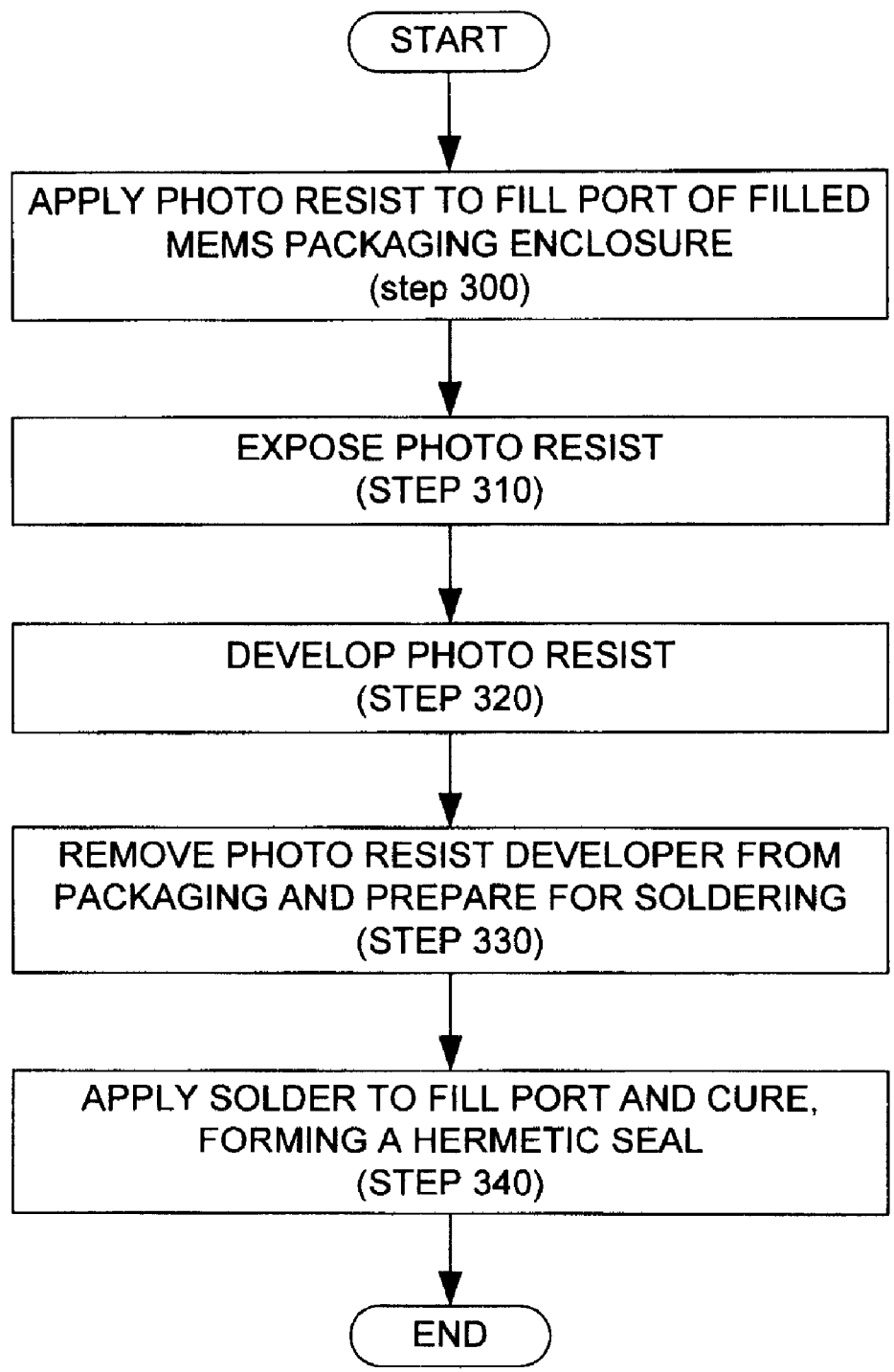
FIG. 3 is a flowchart illustrating a method of creating a hermetic seal for a MEMS package according to one exemplary embodiment

Turning now to FIG. 3, a flowchart illustrates a method for hermetically sealing a fluid filled IC or MEMS package according to one exemplary embodiment. As shown in FIG. 3, the MEMS package sealing process may begin immediately after a MEMS package has been filled with a degassed packaging fluid. Such a fluid filled MEMS package may, upon reception of the degassed packaging fluid, have a quantity of photo resist applied to the fill port (step 300). Once the photo resist has been applied, the photo resist may then be patterned by first exposing it using an appropriate electromagnetic or high energy particle beam and a mask (step 310) and by later developing it in an appropriate developing solution (step 320). Once the photo resist has been developed, the developing solution may be removed from the packaging and the packaging may then be prepared for the application of solder (step 330). Once prepared, solder may be applied in such a way as to make intimate contact with the fill port surfaces, thereby forming a permanent hermetic seal once the solder cools and cures (step 340). The above-mentioned method will now be explained in detail below with reference to FIGS. 4 through 9.

Figure 4:
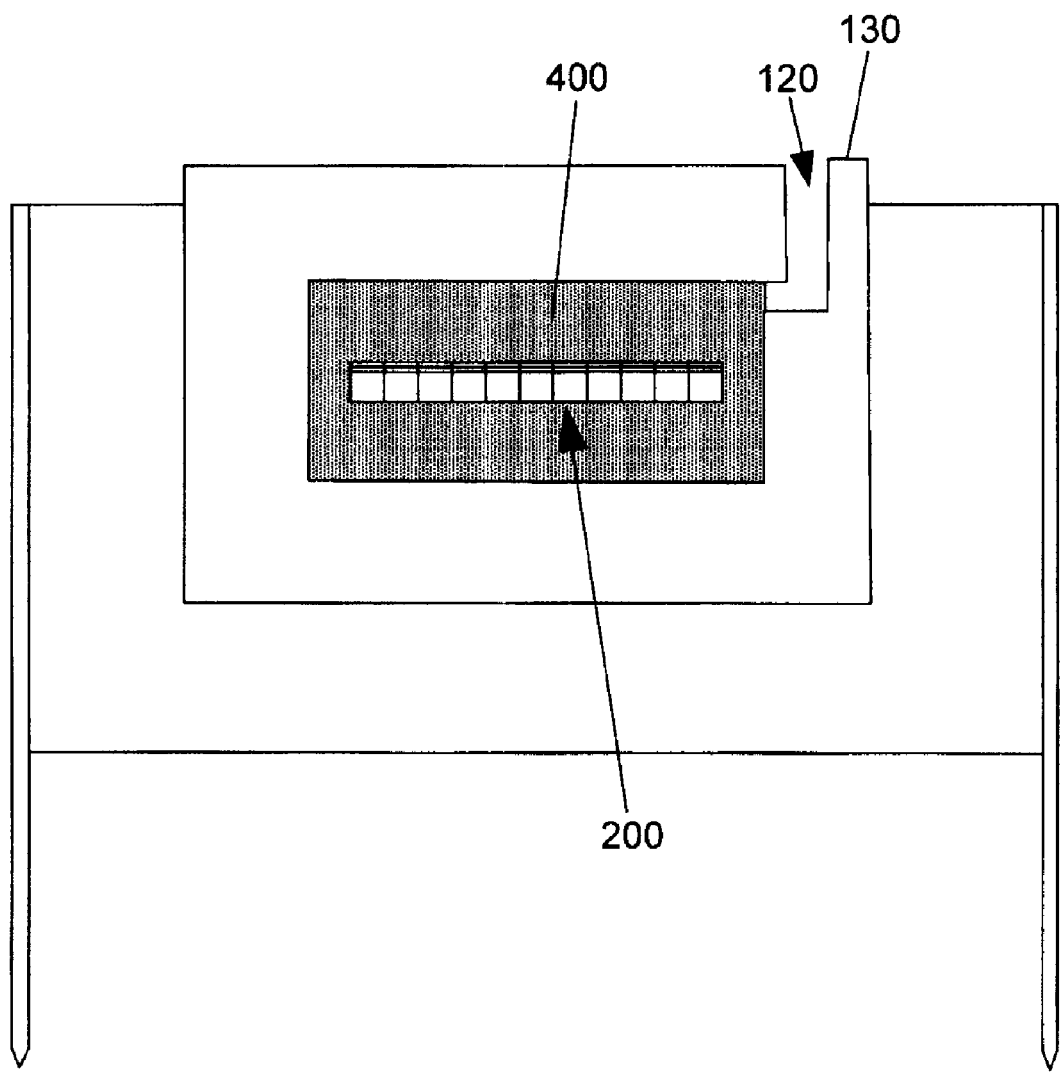
FIG. 4 is a cross-sectional view of a fluid filled MEMS package according to one exemplary embodiment.

As shown in FIG. 3, the present method for forming a hermetic seal in a MEMS package begins by applying photo resist material to a fill port of a MEMS packaging enclosure, thereby forming a temporary seal (step 300). While the photo resist material may be applied to the fill port of a MEMS packaging enclosure containing a gas, a liquid, or a vacuum, the present exemplary method will be described in the context of hermetically sealing a fluid filled MEMS packaging enclosure. FIG. 4 illustrates a cross-sectional view of a fluid filled MEMS packaging enclosure. As shown in FIG. 4, a fluid (400) may surround a MEMS (200) enclosed by the packaging (100). Additionally, the fluid (400) may extend into the fill port channel (120). The fluid (400) used to pack the MEMS (200) may be any degassed fluid configured to support either the MEMS (200) or any other micro-electro-optical mechanical system (MEOMS) while reducing the likelihood of contamination. The fluid (400) enclosed in the packaging may be filled to a level lower than or higher than that illustrated in FIG. 4. Additionally, according to one exemplary embodiment, the fluid (400) may not extend into the fill port channel (120) at all. Alternatively, the fluid (400) may extend outside the fill port channel (120) and onto the fill port pad (130). For the purpose of illustration only, the present embodiment is illustrated having the fluid (400) at a level extending into, but not beyond the fill port channel (120).

Figure 5:
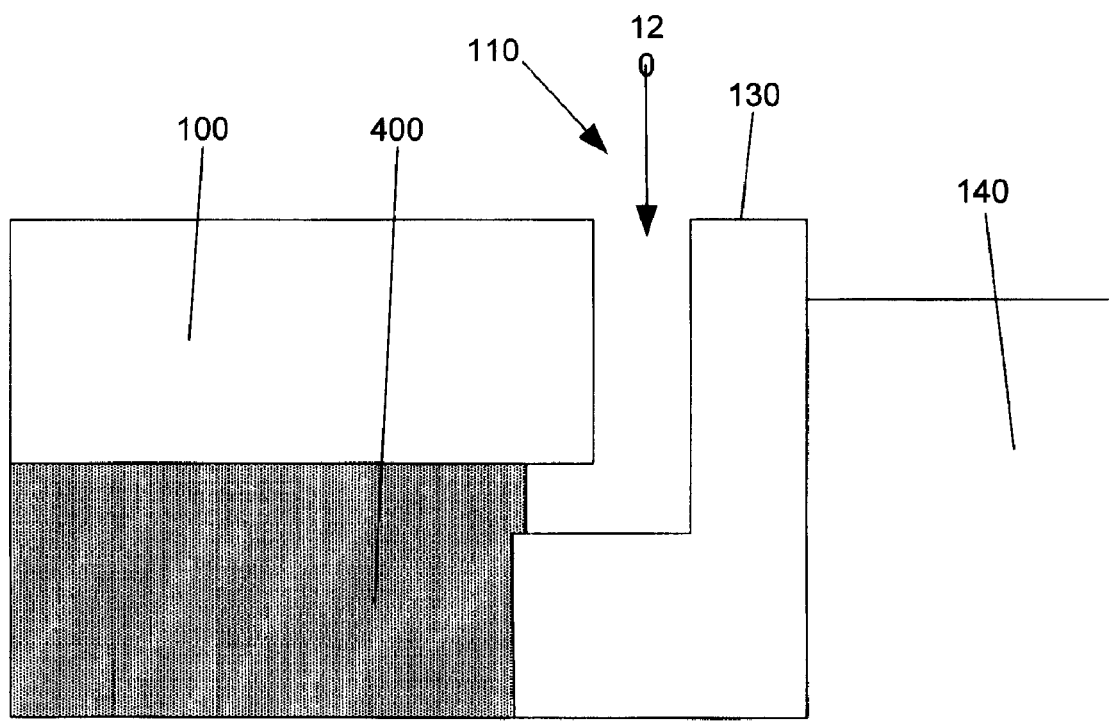
FIG. 5 is a magnified cross-sectional view of a fluid filled MEMS package according to one exemplary embodiment.

FIG. 5 further illustrates the fluid filled MEMS packaging enclosure according to one exemplary embodiment. As shown in FIG. 5, a portion of the inner enclosure (100), including a fill port (110) having a fill port channel (120) and a fill port pad (130) may surround and contain a quantity of fluid (400). A portion of the outer enclosure (140) is also illustrated. A packaging fluid (400) is illustrated inside the inner enclosure (100) and extending into the fill port channel (120). With the inner enclosure (100) being filled with fluid (400), the present method may be performed by first applying photo resist to the fill port of the filled MEMS packaging (step 300; FIG. 3).

Figure 6:
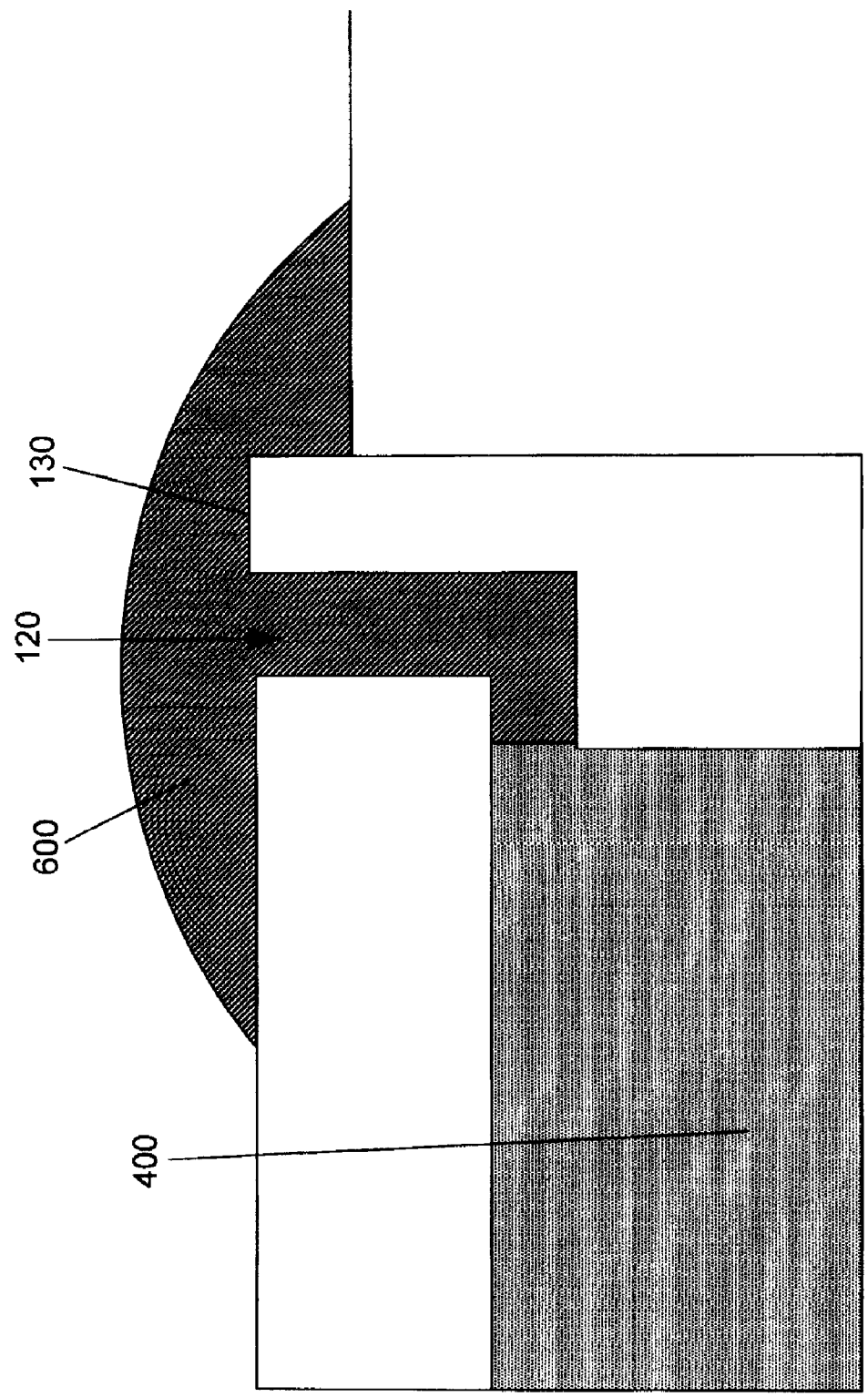
FIG. 6 is a cross-sectional view of a fluid filled MEMS package after application of a photo resist material according to one exemplary embodiment.

FIG. 6 illustrates a cross-sectional view of a portion of a fluid filled MEMS package after a photo resist (600) has been applied as a temporary fill port seal (step 300; FIG. 3). As shown in FIG. 6, the photo resist (600) may be applied in such a way as to fill the fill port channel (120) and make intimate contact with the packaging fluid (400) without creating gas pockets between the packaging fluid (400) and the photo resist (600), thereby reducing the likelihood of MEMS damage and/or malfunction. Once the photo resist (600) fills the fill port channel (120) it adheres to the fill port channel (120) and creates a temporary hermetic seal. Because the photo resist material (600) flows like an adhesive, it is able to conform to variations in the fill port channel (120) geometry and adheres to the gold surface coating the fill port channel (120), thereby creating a temporary seal.

FIG. 6 further illustrates that the photo resist (600) may also extend outside of the fill port channel (120) to form a bead of photo resist (600) common to the fill port pad (130). While FIG. 6 illustrates a single bead being disposed on top of the fill port pad (130), the photo resist (600) may be applied and spun onto the surface of a single MEMS package or an array of packages, substantially covering the upper surface of the package or packages. Once applied to the fill port channel (120), the photo resist (600) effectively arrests the evaporation of packaging fluid and forms a temporary seal over the fluid allowing time to pass before downstream processing steps must be performed.

The photo resist (600) disposed on the fill port channel (120) according to the exemplary embodiment illustrated in FIG. 6 may be either a positive photo resist, wherein the exposed region of the photo resist may become more soluble and may be etched away in a developer while the unexposed regions remain, or a negative photo resist, wherein the exposed region of the photo resist may become resilient to a developer and the unexposed regions may be etched away in a developer. For the purpose of illustration and ease of explanation only, the following exemplary embodiment will be described in the context of a positive photo resist (600), though a negative photo resist is contemplated and may be used to the same effect by inverting a mask used to expose positive photo resist (600).

Figure 7:
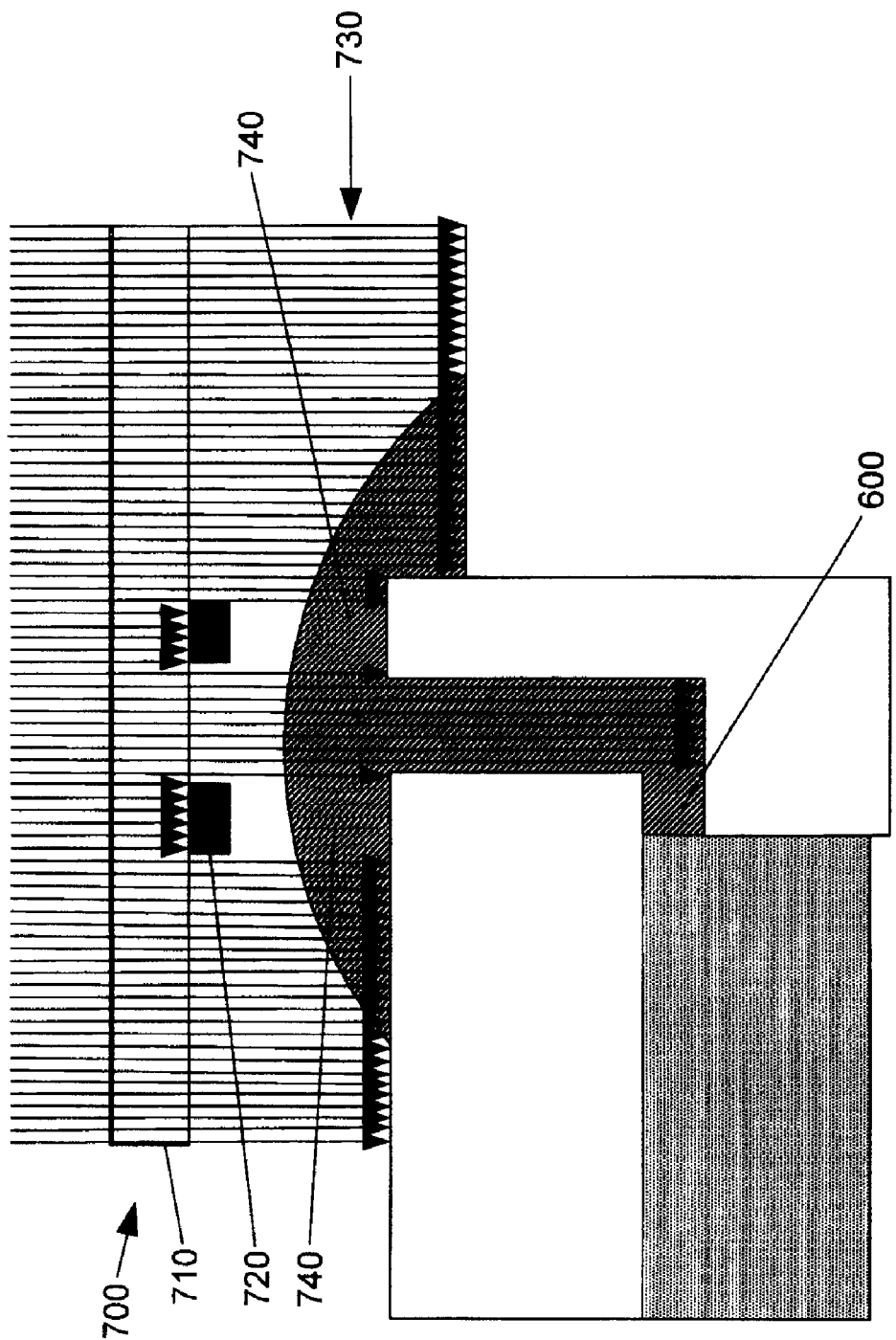
FIG. 7 is a cross-sectional view of an exposure process according to one exemplary embodiment.

Once the photo resist (600) has been applied to the fill port channel (120) as shown in FIG. 6, the photo resist (600) may be exposed (step 310; FIG. 3). FIG. 7 illustrates a cross-sectional view of a quantity of photo resist (600) in the process of being exposed (step 310; FIG. 2). As shown in FIG. 7, the photo resist (600) may be exposed by placing an appropriate mask (700) and an energy source (not shown) in optical communication with the photo resist (600). Using any number of specially designed masks (700), the positive photo resist (600) may be exposed in such a way as to form a ring of unexposed photo resist (740) around the fill port (100; FIG. 5). This ring of unexposed photo resist (740) may be configured to aid in directing solder into the fill port channel (120) and onto the pad (130). Alternatively, the photo resist may not be exposed at all. Rather, a negative photo resist (600) may be developed so as to remove all of the photo resist (600) except a small quantity configured to serve as a temporary seal in the fill port channel (120; FIG. 6).

The mask (700) used to expose the photo resist (600) may include two materials, a first material (710) which is transparent to electromagnetic radiation and a second material (720) which is opaque to electromagnetic radiation. The mask (700) may be disposed in relatively close proximity to the photo resist (600) while disposed at a relatively far distance from the energy source (not shown). This configuration produces, for all practical purposes, a collimated beam or beams of radiation (730). Once the energy source (not shown) is activated, collimated beams of electromagnetic radiation (730) pass through the transparent first material (710) of the mask (700). Once the radiation (730) has passed through the first material (710), it is either blocked by the second opaque material (720) of the mask (700) or allowed to pass and selectively expose the photo resist (600). Once exposed, the regions of positive photo resist (600) exposed to the collimated beams of radiation (730) may undergo a physical or chemical change making them soluble in the presence of a certain developing solution. In contrast, those areas of positive photo resist (600) left unexposed by virtue of the mask (700) may remain resistant or insoluble in the same developing solution.

The energy source (not shown) may produce electromagnetic radiation or a high energy particle beam. For the purpose of illustration only, the present system and method will be described in the context of an energy source that produces electromagnetic radiation, though other types of energy sources may be used with an appropriate photo resist (600). Alternative techniques for exposing the photo resist (step 310; FIG. 2) may include, but are in no way limited to, photolithography, extreme ultraviolet lithography (EUV), or x-ray lithography (XRL) in conjunction with an appropriate photo resist or chemical-amplified resist (CAR). According to one exemplary embodiment, an electron resist may be used and electron-beam lithography may be employed to pattern the electron resist. According to this exemplary embodiment, the electron resist may be selectively formed using a scattering with an angular limitation projection electron beam lithography (SCALPEL) system to form a temporary hermetic seal. In another exemplary embodiment, an ion resist may be used in conjunction with ion-beam lithography to pattern a resist for use as a temporary hermetic seal. For illustration purposes only, a positive photo resist and a photolithographic technique will be presented herein.

Additionally, according to one exemplary embodiment, resolution enhancement techniques may be used in conjunction with the photo lithographic process in order to provide better depth of focus and exposure latitude. These resolution enhancement techniques may include the use of a phase shifting mask (PSM) or a mask with optical proximity correction (OPC).

After exposure of the photo resist (step 310; FIG. 3), the photo resist may be developed in an appropriate developing solution (step 320; FIG. 3). In the case of a positive photo resist (600), exposed areas of the photo resist may become soluble in the developer and may be removed. Conversely, those areas of the photo resist (600) which were not exposed by the energy source (not shown) may be resilient to the developing solution.

Figure 8:
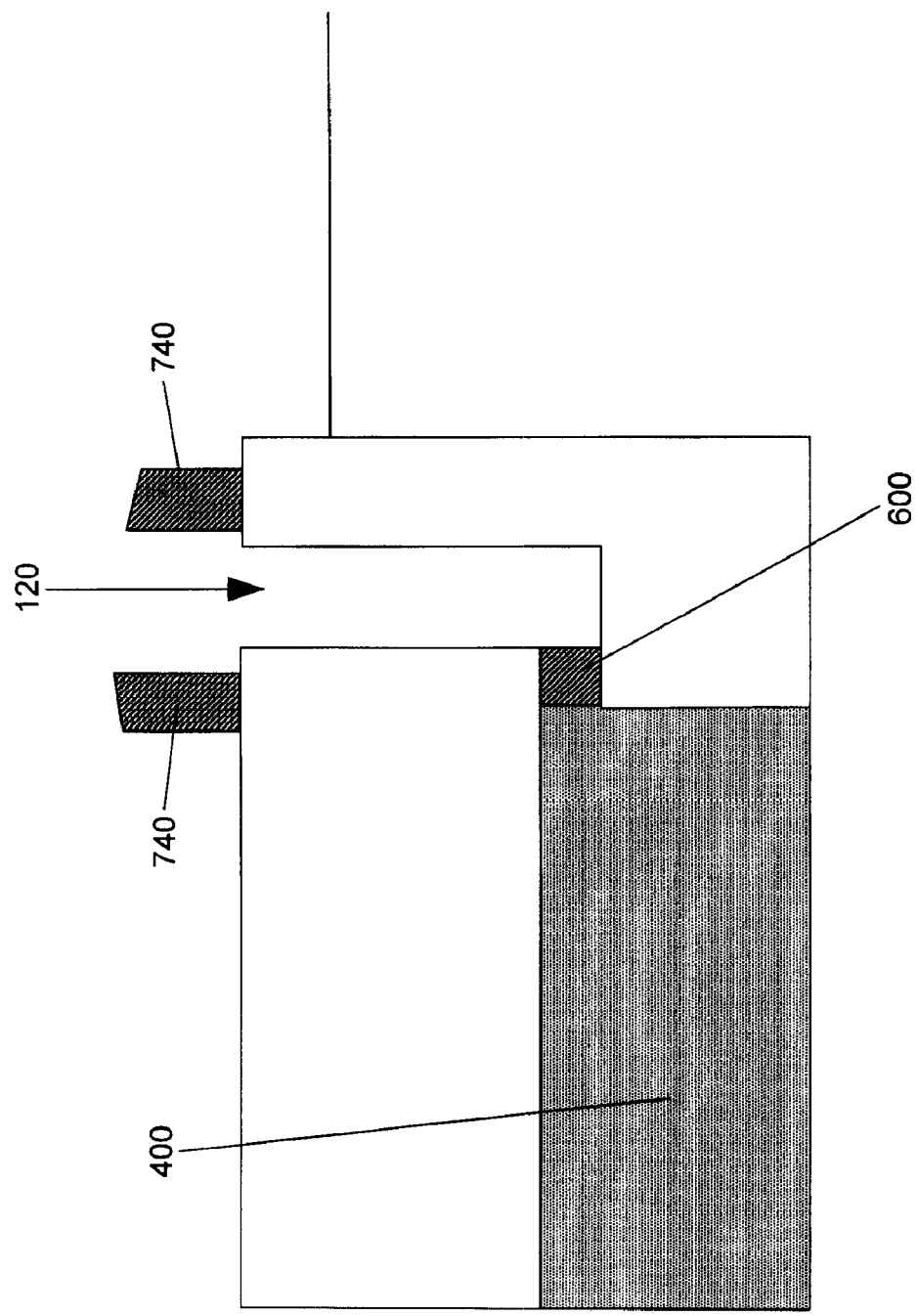
FIG. 8 is cross-sectional view of a developed photo resist according to one exemplary embodiment.

FIG. 8 illustrates a cross-sectional view of a MEMS package after a developing process has been performed thereon. As shown in FIG. 8, upon completion of a developing process (step 320; FIG. 3), an unexposed photo resist ring (740) as well as an unexposed photo resist (600) plug may exist on the package. The previously exposed areas of photo resist (740) yield to dissolution by the developing solution, thereby selectively being removed after the developing process (step 310, FIG. 3). In the exemplary embodiment illustrated in FIG. 8, a ring of unexposed photo resist (740) has been formed in order to aid in a later processing step, namely the application of a solder (step 340; FIG. 3).

Additionally, a quantity of unexposed photo resist (600) may remain in the fill port channel (120) forming a temporary hermetic seal. According to one exemplary embodiment, the quantity of unexposed photo resist (600) that remains during the developing process is dependant upon the length of time the photo resist is exposed, the length of time the photo resist is developed, the type of photo resist used, and the developer in which the photo resist is developed. The unexposed photo resist (600) that remains in the fill port channel (120) functions as a temporary hermetic seal to arrest evaporation or other leakage of the packaging fluid (400) from the MEMS package while also protecting the packaging fluid from contamination or heat introduced by solder flux in a subsequent soldering step (step 340; FIG. 3). Unexposed photo resist (600) may also remain on other portions of the MEMS packaging (not shown), depending on developing parameters implemented.

Following the photo resist development (step 320; FIG. 3), developer may remain on portions of the MEMS package. A developer residue may be removed by washing the MEMS package in de-ionized water or another appropriate solution. Once washed, the washing solution may then be removed by evaporation, either unassisted or with the aid of a drying solvent.

Figure 9:
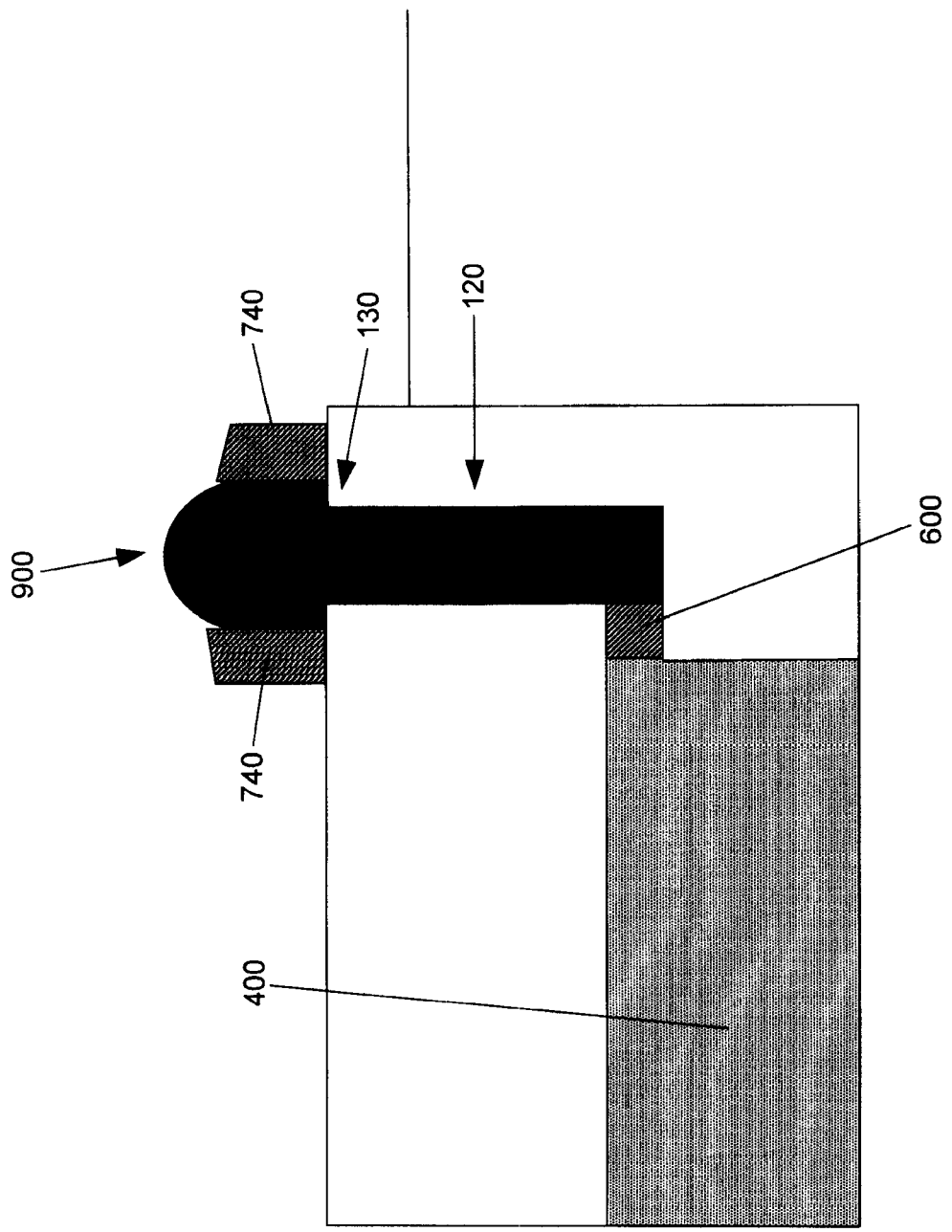
FIG. 9 is a cross-sectional view of a hermetically sealed MEMS package according to one exemplary embodiment.

Following developer removal (step 330; FIG. 3), solder may be applied to the fill port channel (120) to create a permanent hermetic seal. Turning now to FIG. 9, a hermetic solder seal (900) is shown in the fill port (120) of a MEMS package. After making intimate contact with surfaces of the fill port channel (120) and fill port pad (130), the solder (900) may adhere to and form a permanent hermetic seal to the gold and other surfaces in the fill port channel (120) and/or over the fill port pad (step 340; FIG. 3).

Application of the solder (step 340; FIG. 3) may be performed by first applying a solder paste containing flux to improve the wetting characteristics of the solder (900) upon re-flow. Once the solder paste has been applied to the fill port channel and to other locations where the solder (900) is desired, the solder may be heated and distributed according to a re-flow process. As noted above with reference to FIG. 8, a fill port plug made of unexposed photo resist (600) may remain in the fill port channel (120) providing a barrier between packaging fluid (400) and solder (900) containing solder flux. The barrier of unexposed photo resist (600) may insulate the packaging fluid from the solder during solder application. This insulating barrier formed by the unexposed photo resist (600) will prevent solder flux from mixing with the packaging fluid while simultaneously insulating the packaging fluid from higher temperatures attendant to a molten solder. Eliminating contamination of the fluid (400) by solder flux prevents damage to the MEMS contained in the MEMS package. Additionally, the insulation provided by the unexposed photo resist (600) prevents the fluid (400) from being heated to its boiling point, a condition that would create undesirable bubbles to be formed within the fluid (400) as well as change the fluid pressure thereby damaging the MEMS (200; FIG. 4). Furthermore, the solder (900) used in the present system and method may be a low temperature solder in order to maintain lower solder application temperatures.

Application of the solder (900) may also be facilitated by an unexposed and developed photo resist ring (740) or other developed photo resist structure. As shown in FIG. 9, the unexposed and developed photo resist (740) may surround a quantity of deposited solder (900) thereby securing its location on the MEMS package. This ring allows the solder (900) to cool and solidify in a stationary condition thereby maintaining contact with the fill port channel (120) and fill port pad (130). By maintaining contact with the above-mentioned surfaces, a permanent hermetic seal is produced by the cooled solder (900).

Although the photo resist (600) fill port plug need not remain once a hermetic solder seal has been formed over the fill port (110), the photo resist (600) fill port plug may be left intact since it may not harm the MEMS and may be difficult to remove once the solder (900) has set. Similar to the photo resist (600) fill port plug, once the permanent hermetic seal is formed by the solder (900), the unexposed photo resist solder ring (740) may no longer be needed. The unexposed photo resist solder ring (740) may be left intact or removed by any number of mechanical or chemical means.

Figure 10:
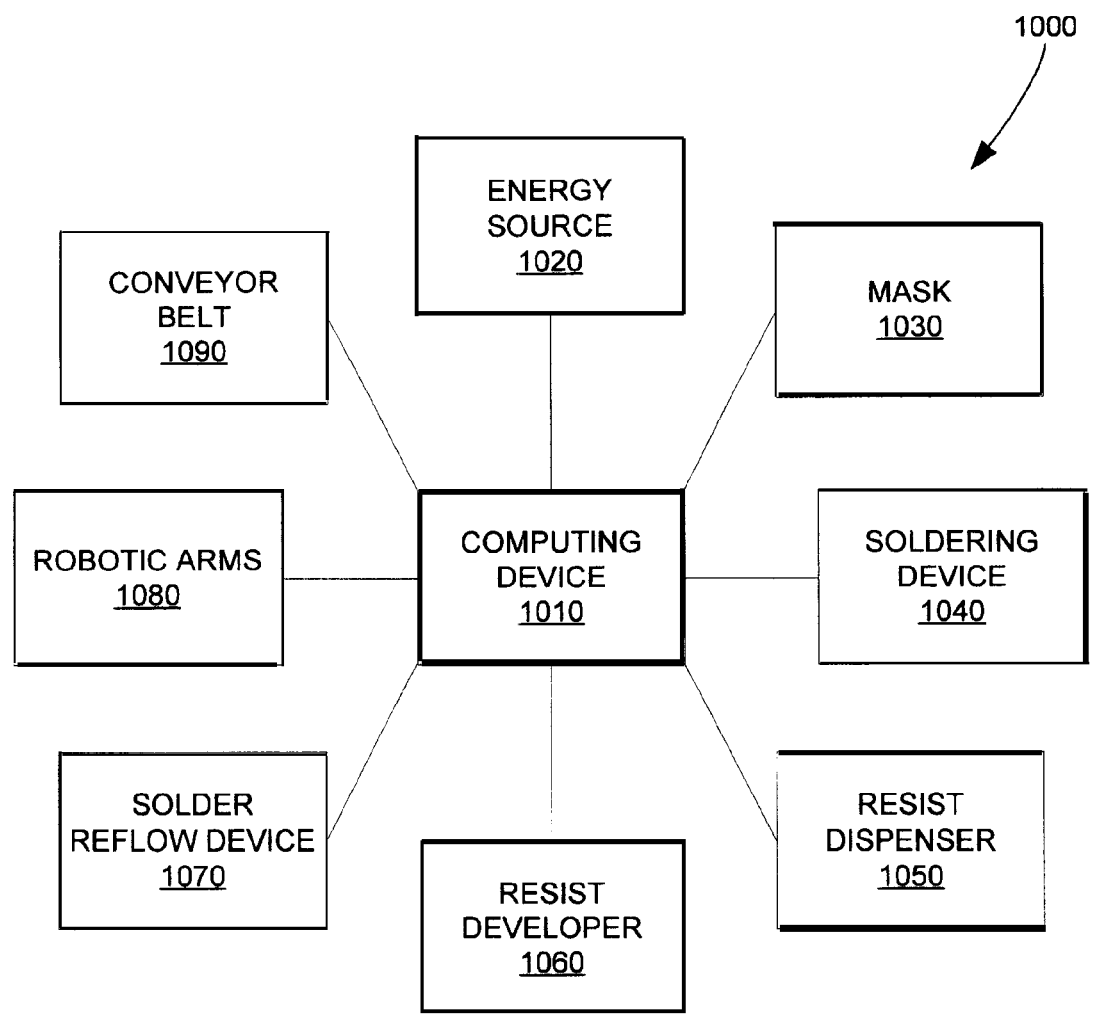
FIG. 10 is a simple block diagram illustrating the components of an automated MEMS packaging system according to one exemplary embodiment.

FIG. 10 illustrates an automated embodiment of the present system and method. As shown in FIG. 10, an automated system (1000) for hermetically sealing a MEMS package may include a computing device (1010) communicatively coupled to an energy source (1020), a mask (1030), a soldering device (1040), a resist dispenser (1050), a resist developer (1060), and a solder reflow device (1070). When a request is made to hermetically seal a MEMS package, the computing device (1010) may controllably move and operate the coupled devices to perform the method illustrated in FIG. 3. Additionally the coupled computing device (1010) may be configured to aid in or entirely regulate a decision making process associated with the hermetic sealing of a MEMS package. Moreover, the computing device (1010) may govern robotic arms (1080), conveyer belts (1090), or other means to move, rotate, or otherwise manipulate the MEMS package, photolithographic masks (1030), energy source (1020), soldering device (1040), resist dispenser (1050), resist developer (1060), and/or solder reflow device (1070) in order to more fully automate the cleaning process. The computing device (1010) may also govern the length of time the photo resist is exposed, the length of time the photo resist is subsequently developed, as well as the time between various steps in the present method. The computing device may regulate the temperatures of solders and solvents and may direct processing steps in order to produce MEMS packages according to a certain design or to improve the efficiency of the fabrication process. Such an automated hermetic sealing system may stand alone or be incorporated directly into an IC fabrication or packaging foundry.

In conclusion, the present method for hermetically sealing MEMS packages maintains a stable ambient pressure in the packaging fluid while photo resist is applied and patterned as well as while solder is applied, thereby effectively producing a higher yield of working MEMS devices. By disposing the photo resist in intimate contact with the packaging fluid and eliminating the formation of bubbles, severe packaging fluid pressure increases may be avoided during solder application as the thermal coefficient for gases is generally much greater than that of fluids or solids. Similarly, by leaving a photo resist plug in the fill port channel and in contact with the packaging fluid, the packaging fluid may effectively be insulated from the higher temperatures of the molten solder being applied to the fill port. Finally, using a low temperature solder may also decrease the severity of pressure fluctuations in the packaging fluid, thereby lowering the chances of damaging MEMS devices being packaged.

Moreover, the sealing process described above allows for the passage of time between steps. The application of a photo resist material may be performed immediately after the MEMS packaging enclosure has been filled with a packaging fluid in order to arrest packaging fluid evaporation and maintain a packaging fluid level. However, once this temporary photo resist seal has been set later processing steps may not need to be performed immediately, allowing some flexibility in downstream processing. The same may be said after photo resist patterning is complete as long as a photo resist plug is left intact in the fill port channel.

Furthermore, a photo resist fill port plug may serve to prevent solder flux from contaminating the packaging fluid of a MEMS package during solder application. This contamination barrier prevents potential damage to a MEMS device that may otherwise occur if solder flux were allowed to penetrate the MEMS package enclosure.

The preceding description has been presented only to illustrate and describe exemplary embodiments of the present system and method. It is not intended to be exhaustive or to limit the system and method to any precise form disclosed. Many modifications and variations are possible in light of the above teaching. It is intended that the scope of the system and method be defined by the following claims.

What is claimed is:

1. An integrated circuit (IC) package, wherein said IC package was formed by:
   sealing a fill port with a light or energy active resist;
   patterning said resist; and
   hermetically sealing said fill port with a solder;
   wherein a portion of said resist remains in said IC package.

2. The package of claim 1, wherein:
   said resist comprises a photo resist; and
   said patterning said resist comprises a photolithographic process.

3. The package of claim 2, wherein said photo resist comprises one of a negative photo resist or a positive photo resist.

4. The package of claim 3, wherein said sealing a fill port with a light or energy active resist comprises disposing said resist in said fill port such that said resist is in intimate contact with said packaging fluid.

5. The package of claim 4, wherein said photolithographic process removes a portion of said photo resist sufficient to exposes a surface of a fill port channel or a fill port pad;
   wherein said solder hermetically seals to said surface.

6. The package of claim 1, further comprising:
   a ring disposed around said fill port;
   wherein said ring is exposed resist configured to aid in an application of said solder.

7. A hermetically sealed package comprising:
   an inner enclosure;
   a fill port channel coupling said inner enclosure to an atmosphere;
   a quantity of resist disposed in said fill port channel; and
   a quantity of solder disposed in said fill port channel, wherein said quantity of solder hermetically seals said inner enclosure.

8. The hermetically sealed package of claim 7, further comprising a quantity of fluid disposed in said inner enclosure.

9. The hermetically sealed package of claim 8, wherein said quantity of resist is configured to insulate said fluid during an application of said quantity of solder.

10. The hermetically sealed package of claim 7, further comprising a micro-electro mechanical system (MEMS) or a micro-electro-optical mechanical system (MEOMS) disposed in said inner enclosure.

11. The hermetically sealed package of claim 7, further comprising a ring of resist disposed on said package around said fill port channel;
    wherein said ring of resist is configured to guide said quantity of solder into said fill port channel.

12. The hermetically sealed package of claim 7, wherein said quantity of resist comprises one of a negative photo resist or a positive photo resist.

13. A hermetically sealed micro-electro mechanical system (MEMS) package comprising:
    an inner enclosure;
    a MEMS disposed in said inner enclosure;
    a fill port channel coupling said inner enclosure to an atmosphere;
    a quantity of resist disposed in said fill port channel; and
    a quantity of solder disposed in said fill port channel, wherein said quantity of solder hermetically seals said inner enclosure.

14. The hermetically sealed MEMS package of claim 13, further comprising a filling fluid disposed in said inner enclosure.

15. A hermetically sealed package comprising:
    a means for enclosing an integrated circuit or a MEMS;
    a means for channeling a fluid into said means for enclosing;
    a quantity of resist disposed in said means for channeling; and
    a means for hermetically sealing a channel disposed in said means for channeling, wherein said means for hermetically sealing hermetically seals said means for enclosing.

16. The hermetically sealed package of claim 15, further comprising a quantity of fluid disposed in said means for enclosing an integrated circuit or a MEMS.

17. The hermetically sealed package of claim 16, wherein said quantity of resist is configured to insulate said fluid during an application of said means for hermetically sealing.

18. The hermetically sealed package of claim 15, further comprising a micro-electro mechanical system (MEMS) or a micro-electro-optical mechanical system (MEOMS) disposed in said means for enclosing.

19. The hermetically sealed package of claim 15, further comprising a ring of resist disposed on said package around said means for channeling;
    wherein said ring of resist is configured to guide said means for hermetically sealing into said means for channeling.

20. The hermetically sealed package of claim 15, wherein said quantity of resist comprises one of a negative photo resist or a positive photo resist.

21. The hermetically sealed package of claim 15, wherein said means for hermetically sealing a channel comprises a quantity of solder.

* * * * *